United States Patent
Lenhart et al.

(12)

(10) Patent No.: US 6,519,817 B1
(45) Date of Patent: Feb. 18, 2003

(54) PCB-MOUNTED CATV HYBRID GROUNDING CLIP

(75) Inventors: Kevin Lenhart, Horsham, PA (US); Dennis Patrick Conroy, Sellersville, PA (US); John Ramspacher, Green Lane, PA (US); Jamie Jay Swift, Bristol, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/939,989

(22) Filed: Aug. 27, 2001

(51) Int. Cl.[7] ............... H01R 12/00; H05K 1/00

(52) U.S. Cl. .................................. 24/458; 439/108

(58) Field of Search .................. 24/458, 457, 293, 24/294, 295; 361/753; 439/108, 572, 570, 567, 575; 174/57, 58, 66; 248/27.1, 27.3

(56) References Cited

U.S. PATENT DOCUMENTS

| | | | | |
|---|---|---|---|---|
| 3,168,612 A | * | 2/1965 | Sorenson | 174/57 |
| 4,629,278 A | * | 12/1986 | Norton et al. | 439/570 |
| 5,647,748 A | * | 7/1997 | Mills et al. | 439/81 |
| 5,865,413 A | * | 2/1999 | Niemann et al. | 248/314 |
| 5,951,307 A | * | 9/1999 | Klein et al. | 439/92 |
| 5,953,217 A | * | 9/1999 | Klein et al. | 361/799 |
| 6,071,131 A | * | 6/2000 | Pliml, Jr. | 439/95 |
| 6,231,356 B1 | * | 5/2001 | Stutts et al. | 439/92 |

\* cited by examiner

*Primary Examiner*—Robert J. Sandy (57) ABSTRACT

A hybrid grounding clip formed from a single piece of sheet metal. The grounding clip includes a base having opposing ends, opposing sides and a slot defined therethrough. The clip further includes a set of attachment legs formed from downwardly bent portions of the base, and at least one contact flange formed from a portion of the base which is bent at an angle of less than 90° with respect to the base located inwardly from at least one of the opposing sides along the slot.

11 Claims, 6 Drawing Sheets

PCB-MOUNTED CATV HYBRID GROUNDING CLIP

BACKGROUND OF THE INVENTION

Field of the Invention

The present invention involves a grounding clip. More specifically, the invention provides a contact pressure grounding clip used in connection with CATV hybrids mounted in broadband telecommunication nodes and amplifiers.

BACKGROUND INFORMATION

Production of a highly reliable grounding system for CATV hybrids, which are attached to PC boards, is a constant problem for the cable television industry. Despite numerous attempts at different designs, problems still remain with providing adequate reliable grounding for these systems. Typical systems use two grounding lugs which are attached to a PC board through soldered connections and are then screwed to the CATV hybrid housing to provide a ground. In these systems, excessive time is spent connecting the lugs to the board and then installing screws to provide the grounding connection to the CATV hybrid. These known connectors can cause inductive coupling and insufficient grounding to the PC board, affecting the overall performance of the system. This inductive coupling can lead to short circuiting of the board itself, damage to the circuit subsystems, decreased circuit component life, and diminished performance of the board. In current lug designs, attempts have been made to solve inductive coupling issues by varying the size and geometry of the grounding lugs. While these attempts have been partly successful, the known lugs do not alleviate these inadequacies.

In addition to electrical concerns, existing systems also have mechanical related problems. Transmitting networks or systems are expected to have long service lives and extremely high reliability. As a result, fatigue and the mechanical strength of the known grounding lugs often becomes critical to system reliability. If a constant force is not maintained between the grounding lug and the attached component, proper grounding may be lost.

SUMMARY

The current invention provides a hybrid grounding clip formed from a single piece of material. The clip comprises a base having opposing ends, opposing sides and a slot defined therethrough. A set of attachment legs is formed from downwardly bent portions of the base, and at least one contact flange is formed from a portion of the base which is bent at an angle of less than 90° with respect to the base located inwardly from at least one of the opposing sides along the slot.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EMBODIMENT(S)

The ensuing detailed description provides preferred exemplary embodiments only, and is not intended to limit the scope, applicability, or configuration of the invention. Rather, the ensuing detailed description of the preferred exemplary embodiment(s) will provide those skilled in the art with an enabling description for implementing a preferred exemplary embodiment of the invention. It being understood that various changes may be made in the function and arrangement of elements without departing from the spirit and scope of the invention as set forth in the appended claims.

The current invention provides a contact pressure grounding clip 10,110,210, 310 used in connection with CATV hybrids mounted in broadband telecommunication nodes and amplifiers. The hybrid grounding clip 10, 110,210,310 provides an improved connection for grounding to PC boards with low inductance and easy installation. Furthermore, the clip 10, 110,210,310 is easily manufactured using conventional sheet-metal stamping technology. The clip 10, 110, 210, 310 provides a low resistance, low inductance ground path not currently achievable with existing lugs. The design improves the overall high frequency RF performance by linking a hybrid ground directly to the PCB ground, improving flatness response. The clip 10, 110, 210, 310 also helps to minimize the effects of undesired signal feedback within the CATV hybrid.

Figure 1:
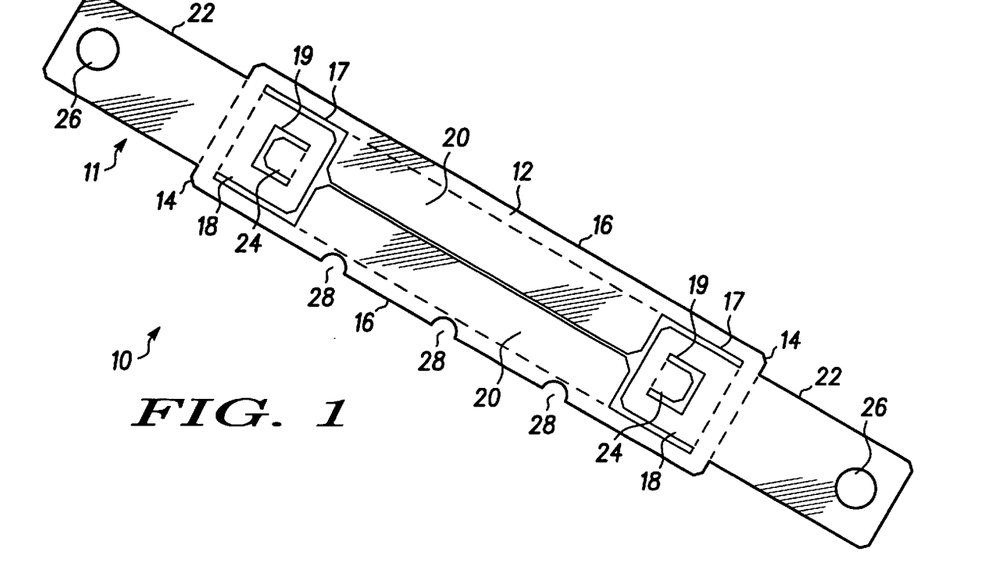
FIG. 1 is a top view of a material blank showing the cut and bend lines used to fabricate a first embodiment of a hybrid grounding clip.
Figure 2:
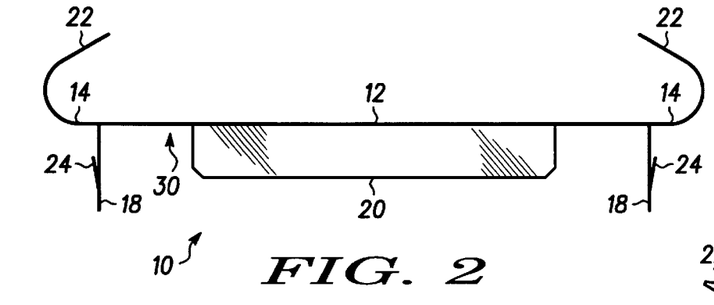
FIG. 2 is a side view of the first embodiment of the hybrid grounding clip formed from the blank of FIG. 1.
Figure 3:
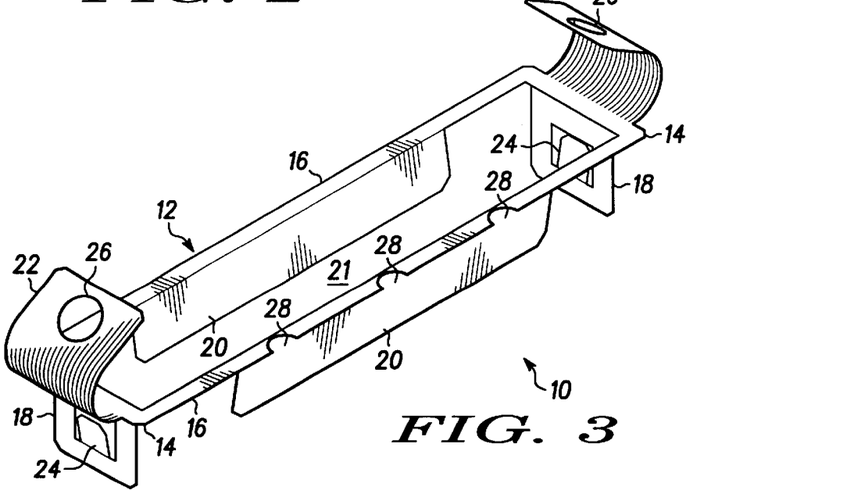
FIG. 3 is an isometric view of the first embodiment of the hybrid grounding clip formed from the blank of FIG. 1.

Referring to FIGS. 1, 2 and 3, a hybrid grounding clip 10 in accordance with a first embodiment of the invention is shown. As shown in FIG. 1, the first embodiment of the hybrid grounding clip 10 is preferably formed from a material blank 11 which includes cut-outs 17, 19 which allow the blank 11 to bend-up to form the clip 10. As shown in FIGS. 1–3, the hybrid grounding clip 10 comprises a base 12 which has opposing ends 14 and opposing sides 16. Attachment legs 18 extend away from the base 12 and include offset tabs 24 spaced from an underside 30 of the base 12. As shown in FIG. 2, two attachment legs 18 are preferably provided, however, the number of attachment legs may be varied depending on the particular application.

Grounding lugs 22 extend from the ends 14 of the base 12 to provide grounding attachment points for the CATV hybrid. In the preferred embodiment, the lugs 22 are curved. However, those skilled in the art will recognize that the lugs 22 may have different geometries. A hole 26 is located in each of the grounding lugs 22 to enable connection of the lugs 22 to the hybrid casing with screws. The size and location of the holes 26 may be varied to suit particular applications.

At least one contact flange 20, and preferably two opposing contact flanges 20, extend downwardly from the base 12 at an angle of less than 90° to define a slot 21 to receive the hybrid in the grounding clip 10. In the preferred embodiment, the contact flanges are bent to an angle of about 70°. The contact flanges 20 are preferably resilient so that upon insertion, they press against the sides of the hybrid housing with a spring force to provide grounding contact that can be maintained over time without the prior known problems of only having a screw connection for grounding. Both the contact flange or flanges 20 and the grounding lugs 22 may be used to provide long term, high reliability grounding for the attached hybrid circuitry.

The clip 10 may be fabricated through bending, machining or other metal forming techniques. The hybrid grounding clip 10 is preferably manufactured such that the distance between the uppermost portion of the tabs 24 and the base underside 30 will be the approximate thickness of a PC board to which it is to be attached. The size of the grounding clip 10 may be varied according to particular applications.

Referring to FIG. 3, one of the opposing sides 16 of the base 12 includes cut-outs 28 which are used to provide necessary clearance between the hybrid grounding clip 10 and other components or sockets on a PC board. Although shown with three cut-outs 28, it will be understood by those skilled in the art that the number and size of cut-outs 28 may be varied depending upon the PC board layout and the available space for the grounding clip 10, or may be entirely omitted.

The hybrid grounding clip 10 may be attached to a PC board through various means including, but not limited to, soldering, conductive adhesive, or mechanical connection. In a preferred embodiment, an attachment will be made between the hybrid grounding clip 10 and the PC board via infrared convection soldering.

In the preferred embodiment, the hybrid grounding clip 10 is made from a Beryllium-Copper alloy. Other preferred materials include Phosphor-Bronze alloys and other materials capable of being treated to a medium spring temper in order to provide the desired resiliency for the contact flanges 20. In the preferred embodiment, Beryllium-Copper sheet metal conforming to UNC C17200 standards and having a 0.005 to 0.007 inch thickness is used. After the grounding clip 10 is formed, it is heat treated to 600° F. for two hours and is then plated with a 0.0002 inch minimum thickness copper, followed by a 0.0001 to 0.00022 inch bright acid tin plate. This provides a surface that can be soldered to the PC board as well as providing excellent conductivity for grounding contact with a CATV hybrid or other device. Preferably all bends for the clip 10 are to be at a 0.010 inch radius. However, other bend radii can be used depending upon the material and thickness.

The hybrid grounding clip 10 may be installed on a PC board by pressing the hybrid grounding clip 10 into a board opening such that the upper edges of the tabs 24, which are outwardly biased, engage the bottom of the PC board after the grounding clip 10 is pressed into an appropriately sized opening. This allows the hybrid grounding clip 10 to be held in position on a PC board prior to soldering.

Figure 4:
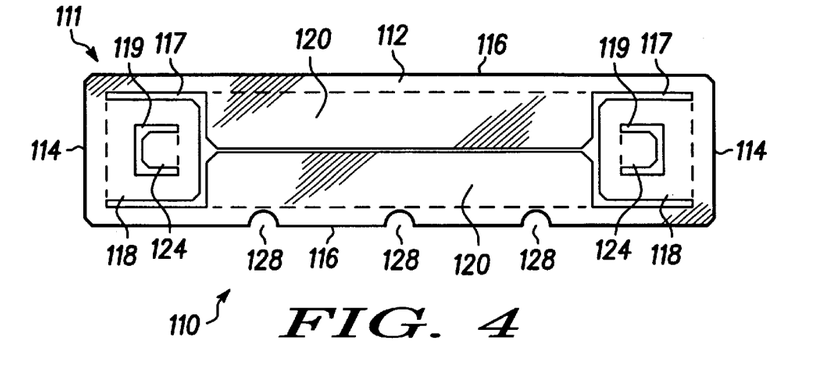
FIG. 4 is a top view of a material blank showing the cut and bend lines used to fabricate a second embodiment of a hybrid grounding clip.
Figure 5:
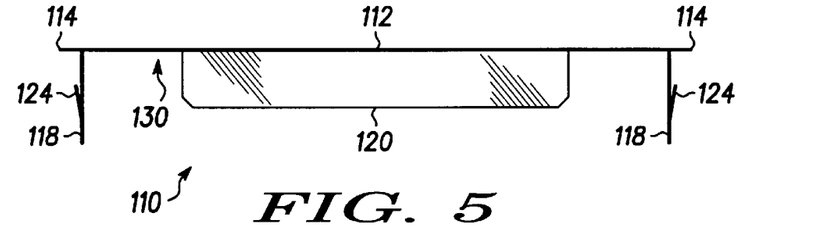
FIG. 5 is a side view of the second embodiment of the hybrid grounding clip formed from the blank of FIG. 4.
Figure 6:
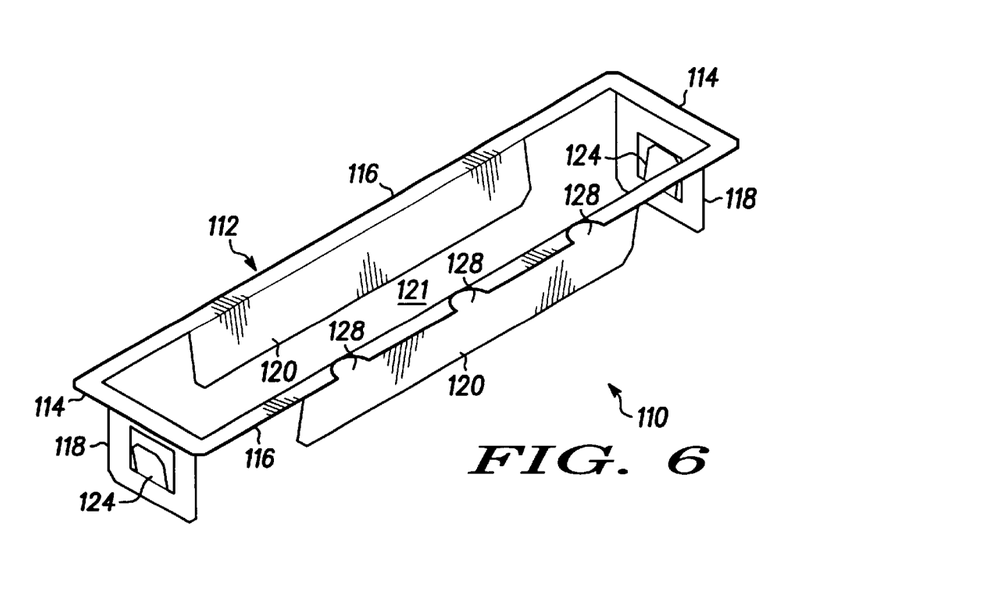
FIG. 6 is an isometric view of the second embodiment of the hybrid grounding clip formed from the blank of FIG. 4.

Referring now to FIGS. 4, 5 and 6, a second embodiment of a hybrid grounding clip 110 is shown. The hybrid grounding clip 110 is similar to the hybrid grounding clip 10 except that it does not include the lugs 22. As shown in FIG. 4, the hybrid grounding clip 110 is preferably formed from a material blank 111 which includes cut-outs 117, 119, similar to those described above in connection with the grounding clip 10, which allows the blank 111 to be bent-up to form the clip 110. As shown in FIGS. 5 and 6 when the clip 110 is formed, it includes the base 112 with downwardly bent attachment legs 118 having tabs 124 which extend in an outward direction toward the opposing ends 114. The tabs 124 are located at a distance from the base underside 130 to allow the clip 110 to be retained in a PC board upon insertion into an appropriate opening, prior to soldering.

At least one, and preferably two contact flanges 120 extend from the base 112 on opposite sides of a hybrid receiving slot 121. The flanges 120 are bent at an angle of less than 90° with respect to the base 112, and are preferably bent at an angle of about 70° downwardly. However, the contact flanges 120 could be bent upwardly, if desired. As above, the contact flanges 120 are resilient for grounding through positive contact between the contact flange(s) 120 and an electrical component housing inserted therein, such as a CATV hybrid. The contact flange(s) 120 provide(s) grounding contact through a constant spring force against the component. This type of grounding has proven to be more effective than the prior known screw lug grounds, resulting in the lugs 22 of the first embodiment being unnecessary in many applications.

The slot 121 may be of different geometries and sizes according to the equipment being attached. In the preferred embodiment, the slot 121 is sized to allow insertion of a CATV hybrid typically used in nodes and amplifiers. However, the clip 110 may be used for grounding or providing conductive contact to other components.

Clearance cut-outs 128 may be located on the base 112 to allow the hybrid grounding clip 110 to be installed on a PC board while maintaining adequate clearance between the clip 110 and other PC board components or sockets. Although the base 112 is shown as having three clearance cut-outs 128, those skilled in the art will understand that any number and configuration of clearance cut-outs may be located on the base 112 depending on the particular application.

The second embodiment of the hybrid grounding clip 110 is preferably formed through conventional stamping techniques out of a single piece of sheet metal, similar to the first embodiment 10, and is also preferably formed from the same type of materials. The hybrid grounding clip 110 may also be manufactured from other techniques including, but not limited to, bending, cutting, casting and/or machining.

Figure 7:
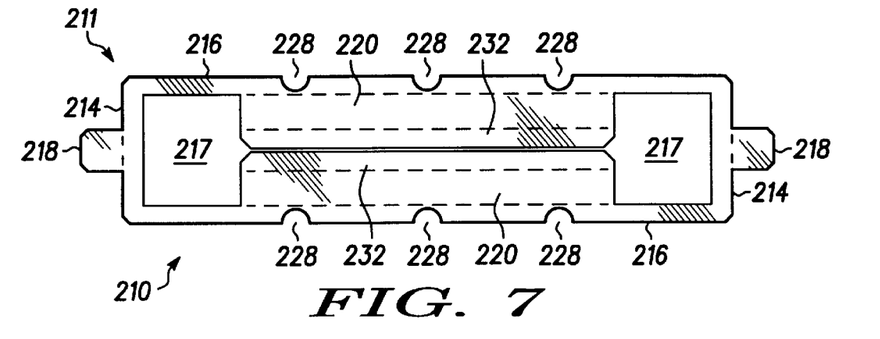
FIG. 7 is a top view of a material blank showing the cut and bend lines used to fabricate a third embodiment of a hybrid grounding clip.
Figure 8:
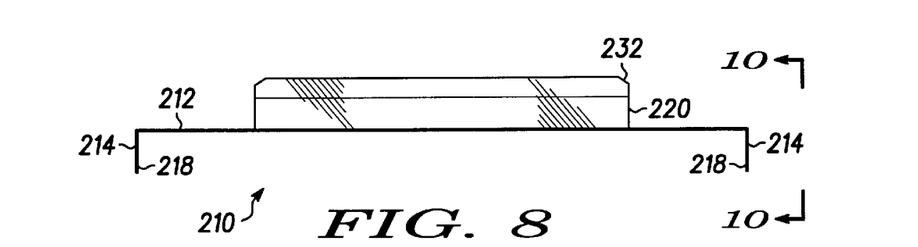
FIG. 8 is a side view of the third embodiment of the hybrid grounding clip formed from the blank of FIG. 7.
Figure 9:
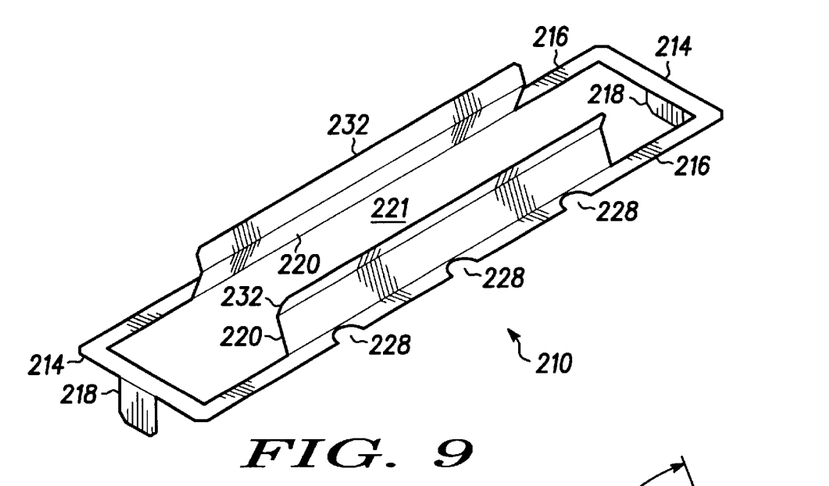
FIG. 9 is an isometric view of the third embodiment of the hybrid grounding clip formed from the blank of FIG. 7.
Figure 10:
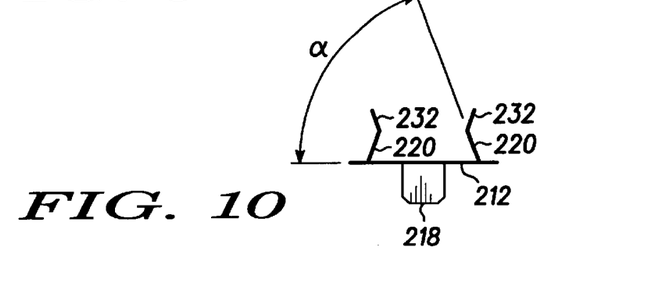
FIG. 10 is an end view of the third embodiment of a hybrid grounding clip taken along line 10—10 in FIG. 8.

Referring now to FIGS. 7–10, a third embodiment of the hybrid grounding clip 210 is shown. As shown in FIG. 7, the hybrid grounding clip 210 is preferably formed from a material blank 211 having a cut-out 217 as shown, which allows the blank 211 to be bent-up to form the clip 210. The clip 210 includes two ends 214 and opposing sides 216. As shown in FIGS. 8–10, the grounding clip 210 includes downwardly bent attachment legs 218. At least one and preferably two resilient contact flanges 220 are preferably bent upwardly at an angle of less than 90° relative to the base 212, as shown in FIG. 10, to form the hybrid receiving slot 221. Preferably, return flanges 232 are located at the ends of the contact flanges 220 in order to allow a hybrid to be inserted and force the contact flanges 220 outwardly. As in the other embodiments, the hybrid grounding clip 210 may be fabricated out of a single piece of sheet metal by stamping as well as other methods of manufacturing. The material is preferably the same as that described above in connection with the first embodiment 10, and is tempered after the clip 210 is formed so that the contact flanges 220 are resilient. Although shown as having two upwardly directed contact flanges 220, those skilled in the art will recognize that the contact flanges 220 may be bent downwardly as in the first and second embodiments. In the third preferred embodiment of the grounding clip 210, the contact flanges are preferably bent at an angle of about 60°.

Figure 11:
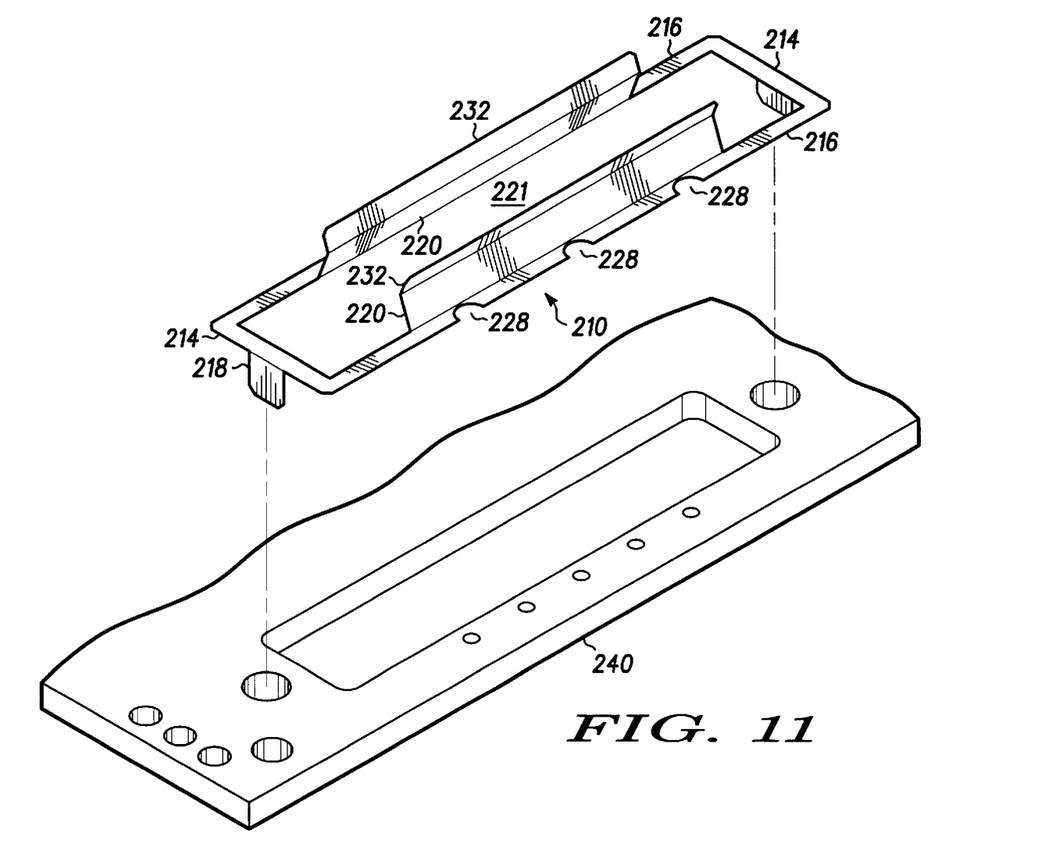
FIG. 11 is an isometric view showing the installation of the third embodiment of the hybrid grounding clip in a PC board.

Referring to FIGS. 8–10, the attachment legs 218 are provided for a locating and/or holding function to place the clip 210 in position on the PC Board 240, as shown in FIG. 11. The hybrid grounding clip 210 is then soldered in position on the PC Board 240 such that it is connected to the ground circuitry on the PC Board 240.

Figure 12:
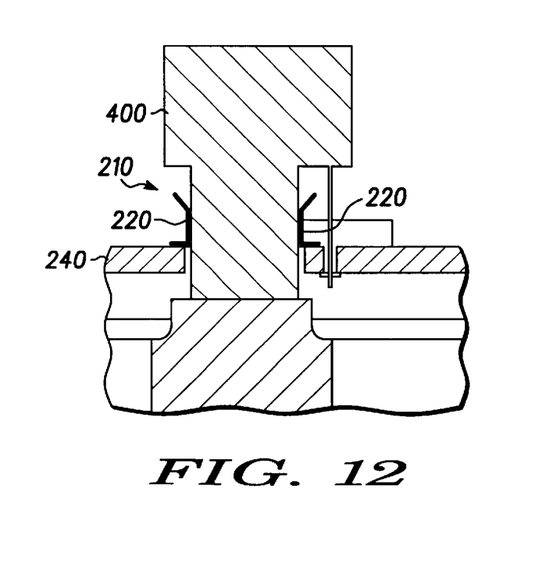
FIG. 12 is a cross-sectional view of an installed hybrid in the third embodiment of the hybrid grounding clip.

Referring to FIG. 12, a hybrid 400 is shown in the installed position in the hybrid grounding clip 210 providing grounding between the hybrid 400 and the PC board 240. The contact flanges 220 are spring tempered and are forced outwardly as the hybrid 400 is inserted so that they provide a positive ground connection to the hybrid 400. Although shown as attached through upwardly bent contact flanges 220 of the third embodiment of the grounding clip 210, the contact flanges may be positioned in a variety of geometries to provide needed grounding contact to the hybrid 400. For example, the contact flanges could be bent downwardly as in the first and second embodiments of the grounding clip 10, 110.

Figure 13:
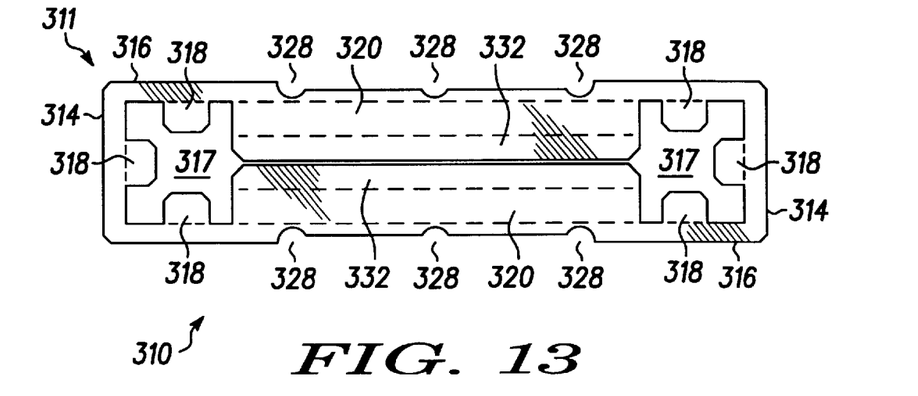
FIG. 13 is a top view of a material blank showing the cut and bend lines used to fabricate a fourth embodiment of a hybrid grounding clip.
Figure 14:
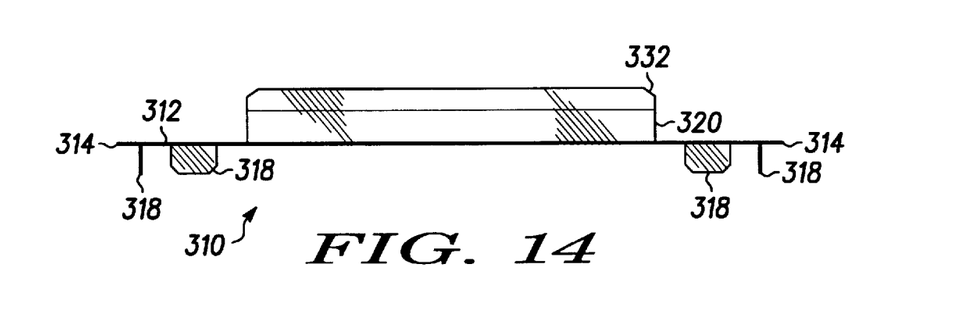
FIG. 14 is a side view of the fourth embodiment of the hybrid grounding clip formed from the blank of FIG. 13.
Figure 15:
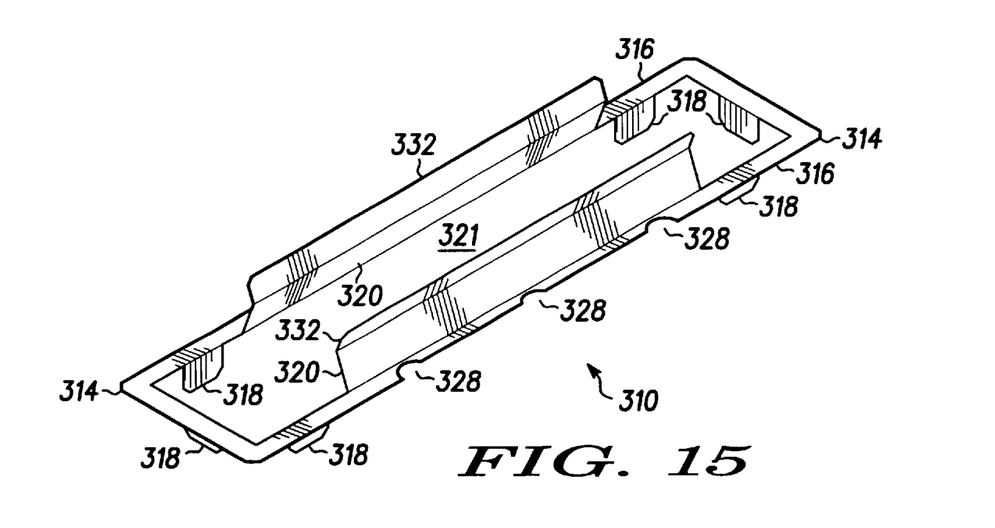
FIG. 15 is an isometric view of the fourth embodiment of the hybrid grounding clip formed from the blank of FIG. 13.

Referring to FIGS. 13–15, a fourth embodiment of the grounding clip 310 is shown. The grounding clip 310 is preferably fabricated from a material blank 311 having a cut-out 317 as shown. The clip 310 includes a base 312 withtwo ends 314 and opposing sides 316. Attachment legs 318 are formed in the material blank to allow the clip 310, to be located and/or held in a PC board having only a single opening for the clip. In the preferred embodiment shown in FIG. 13, six attachment legs 318 are formed on the blank to enable the clip 310 to be installed. Both the number and placement of the attachment legs 318 may be varied. The attachment legs 318 are located along the inner edge of the cut-out 317.

As in the other embodiments, the hybrid grounding clip 310 may be fabricated out of a single piece of sheet metal by stamping as well as other methods of manufacturing. The material is preferably the same as that described above in connection with the first embodiment 10, and is tempered after the clip 310 is formed so that the contact flanges 320 are resilient. Although shown as having two upwardly directed contact flanges 320, those skilled in the art will recognize that the contact flanges 320 may be bent downwardly as in the first and second embodiments. Preferably, return flanges 332 are located at the ends of the contact flanges 320 in order to allow a hybrid to be inserted and force the contact flanges 320 outwardly.

Clearance cut-outs 328 may be located on the base 112 to allow the hybrid grounding clip 310 to be installed on a PC board while maintaining adequate clearance between the clip 10 and other PC board components or sockets.

Figure 16:
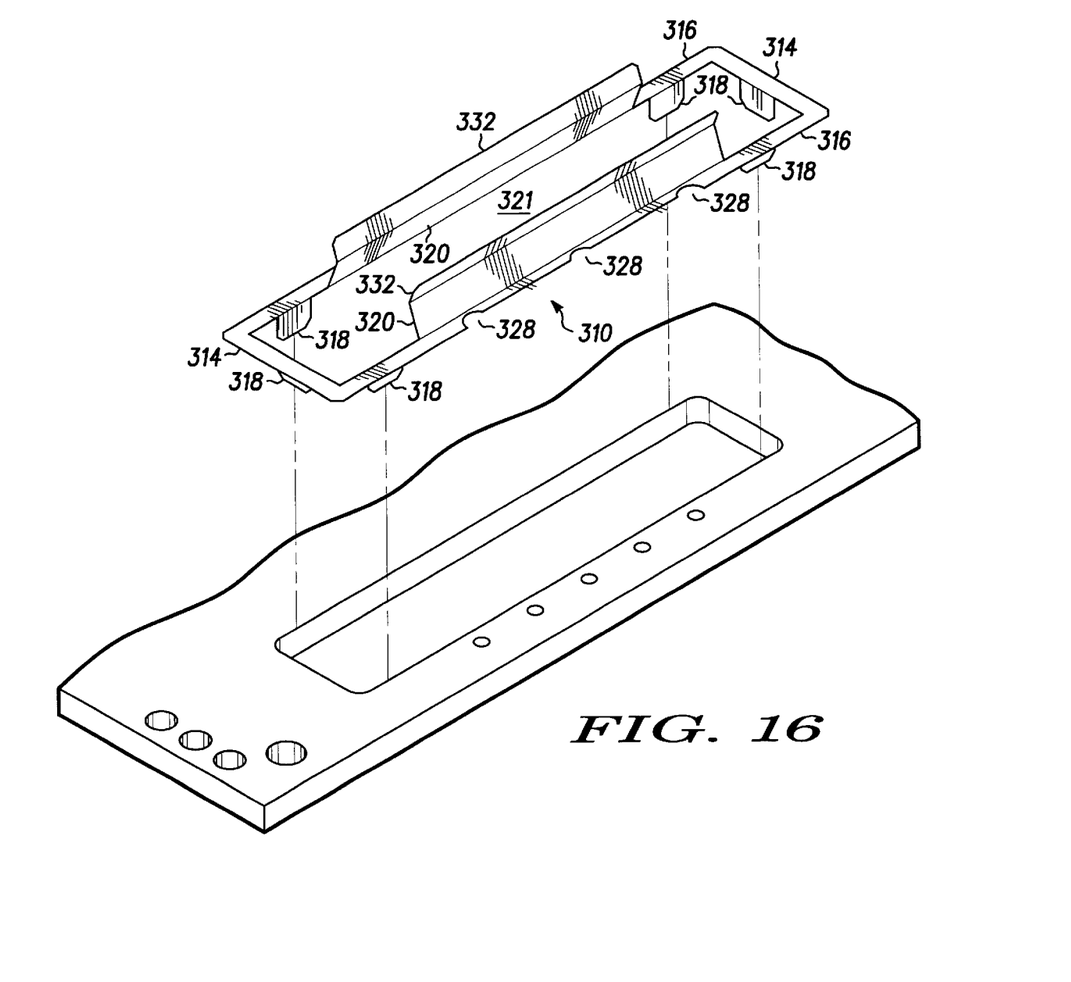
FIG. 16 is an isometric view showing the installation of the fourth embodiment of the hybrid grounding clip in a PC board.

Referring to FIG. 16, the hybrid grounding clip 310 is shown being installed in a PC board. The attachment legs 318 fit into the opening in a PC board providing lateral contact with the board to locate and/or hold the clip 310 in position prior to soldering.

The features described above, when taken in totality, allow the hybrid grounding clips 10, 110, 210 and 310 to provide grounding of a CATV Hybrid 400 or other electronic components to a PC board while reducing inductive coupling effects. This device is particularly suited for use with CATV hybrids 400 mounted in broadband telecommunication nodes and amplifiers. Although described as being used in broadband telecommunications equipment, those skilled in the art will recognize that the grounding clips 10, 110, 210 and 310 may be used in other applications that require grounding or conductive contact. These applications include, but are not limited to, node assemblies, amplifier and laser module assemblies, and optical laser receivers and transmitters.

While the principles of the invention have been described above in connection with specific apparatus, it is to be clearly understood that this description is made only by way of example and not as a limitation on the scope of the invention.

What is claimed is:

1. A hybrid grounding clip formed from a single piece of material comprising:

a base having opposing ends and opposing sides and a slot defined therethrough;

a set of attachment legs adapted to engage with edges of an opening in a PC board to hold the grounding clip in position formed from downwardly bent portions of the base; and at least one contact flange formed from a portion of the base which is bent at an angle of less than 90° with respect to the base located inwardly from at least one of the opposing sides along the slot.

2. The hybrid grounding clip of claim 1, wherein the at least one contact flange comprises two opposing contact flanges located on opposing sides of the slot, each being formed from a portion of the base which is bent at an angle of less than 90° with respect to the base to form an opening having a narrower width than a width of the slot.

3. The hybrid grounding clip of claim 1, wherein the clip is made from a Beryllium-Copper alloy.

4. The hybrid grounding of clip of claim 1, wherein the clip is made from a Phosphor-Bronze alloy.

5. The hybrid grounding clip of claim 1, wherein the attachment legs have outwardly projecting tabs formed thereon, the tabs having ends set at a distance from a bottom of the base, the tabs being adapted to contact a PC board on an opposite side from the base.

6. The hybrid grounding clip of claim 5, wherein the distance from the end of the tab to the bottom of the base is approximately equal to the thickness of a PC board.

7. A hybrid grounding clip formed from a single piece of material comprising:

a base having opposing ends and opposing sides and a slot defined therethrough;

a set of attachment legs formed from downwardly bent portions of the base; and at least one contact flange formed from a portion of the base which is bent at an angle of less than 90° with respect to the base located inwardly from at least one of the opposing sides along the slot, at least one grounding lug extending upwardly from at least one of the opposing ends.

8. The hybrid grounding clip of claim 7, wherein the grounding lugs are curved.

9. The hybrid grounding clip of claim 8, wherein the grounding lugs have at least one hole defined therein.

10. The hybrid grounding clip of claim 1, wherein the attachment legs are located on opposing ends.

11. The hybrid grounding clip of claim 1, wherein the single piece of material is a piece of sheet metal having at least one cut-out defined therein which allow portions of the single piece of material to be bent-up.

* * * * *